(12) United States Patent
Svanbro et al.

(10) Patent No.: US 6,680,921 B1
(45) Date of Patent: Jan. 20, 2004

(54) ESTIMATION OF TIME STAMPS IN REAL-TIME PACKET COMMUNICATIONS

(75) Inventors: Krister Svanbro, Luleå (SE); Lars-Erik Jonsson, Luleå (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/335,550

(22) Filed: Jun. 18, 1999

(51) Int. Cl.[7] ............................................. H04B 7/212
(52) U.S. Cl. ..................................... 370/324; 370/521
(58) Field of Search ................................ 370/324, 350, 370/521; 455/72; 375/240, 354

(56) References Cited

U.S. PATENT DOCUMENTS

| | | | | |
|---|---|---|---|---|
| 5,565,923 A | * | 10/1996 | Zdepski | 348/423 |
| 5,633,871 A | | 5/1997 | Bloks | 370/471 |
| 6,594,276 B1 | * | 7/2003 | Le | 370/465 |

OTHER PUBLICATIONS

Schulzrinne et al., "RTP: A Transport Protocol for Real-Time Applications," Network Working Group, Request For Comments: 1889, Jan. 1996, pp. 1–75.
Casner et al., "Compressing IP/UDP/RTP Headers for Low-Speed Serial Links," Network Working Group, Request For Comments: 2508, Feb. 1999, pp. 1–22.

* cited by examiner

*Primary Examiner*—Wellington Chin
*Assistant Examiner*—Brenda Pham

(57) ABSTRACT

Techniques are provided for efficiently compressing and reconstructing the time stamp value of a real time communications packet whose time stamp value does not fall within a normally expected sequence of time stamp values. A first part of the time stamp value is selected by the header compressor and transmitted. A second part of the time stamp value is estimated by the header decompressor based on elapsed time between receipt of consecutive packets. The header decompressor combines the second part with the first part received from the header compressor to produce a reconstructed time stamp value.

25 Claims, 8 Drawing Sheets

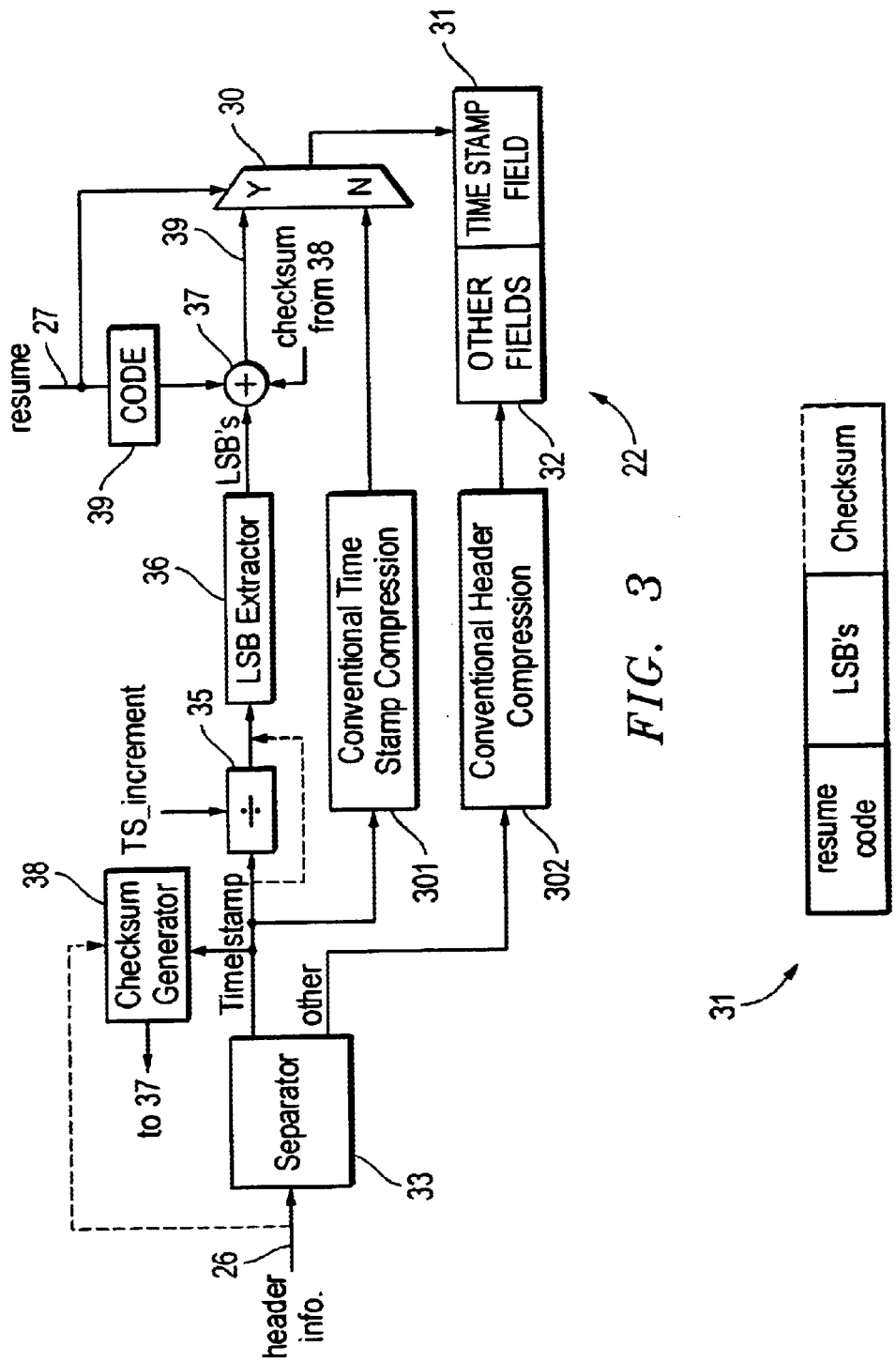

ESTIMATION OF TIME STAMPS IN REAL-TIME PACKET COMMUNICATIONS

FIELD OF THE INVENTION

The invention relates generally to packet communications and, more particularly, to header compression in real-time packet communications.

BACKGROUND OF THE INVENTION

The term header compression (HC) refers to the art of minimizing the necessary bandwidth for information carried in packet headers on a per hop basis over point-to-point links. Header compression is usually realized by sending static information only initially. Semi-static information is then transferred by sending only the change (delta) from the previous header, and completely random information is sent without compression. Hence, header compression is usually realized with a state machine.

Conventional header compression algorithms are designed basically for narrow band wired channels with a rather small complexity at the receiving decompression side. Also, the complexity at the sending compressing side is kept low to allow efficient implementations in routers where as much computing capacity as possible is needed for the routing. Further, the wired channels for which existing header compression algorithms are designed typically have very small probabilities for bit errors (e.g., a bit error rate of $10^{-6}$). Wireless channels (generally characterized by lossy, narrow bandwidth links) typically have a much higher probability for error, so header compression for use in wireless channels should be designed with a much larger bit error probability in mind (e.g., bit error rates up to $10^{-3}$).

Conventional compression schemes for RTP/UDP/IP headers are often based on soft-state machines with states called contexts. The de-compressor context is often updated by each packet received, and if a packet is lost on the link, the context will become invalid. When the decompressor context is invalidated, all successive packets have to be discarded until the soft-state is updated by a full (uncompressed) header. A request for update is sent from the receiving end when the decompressor realizes that the first packet is discarded (or lost), and then it takes a full round-trip (from receiving end to transmitting end and back) before the update (packet with uncompressed header) arrives. This often results in many lost packets. The loss of context state may also occur if the receiving de-compressor fails to successfully de-compress a compressed header.

If the payload for the packets with the compressed headers carries a real time service, the loss of several successive packets may be disastrous for the quality of that real time service. For example, the quality of real time speech service will degrade substantially with increased packet loss rate due to successive lost speech frames. If the speech frame errors have a bursty characteristic, the speech quality will be worse than for the same speech frame error rate but with a less correlated frame error characteristic.

One way of reducing the probability for invalid context states, and thereby packet loss, is to increase the intelligence at the receiver, for example by increasing the probability for the de-compressor to successfully estimate (guess) what the correct context state should be, without using more bits per compressed header. In the example of real time speech service, the conventional RTP time stamp field value typically increments in a predictable fashion (and thus can be reliably predicted or guessed) during periods of speech, but after silent or non-speech periods the time stamp has a more randomized value from the receiver's point of view.

The existing standard for compression of RTP/UDP/IP headers (see, e.g., Steven Casner and Van Jacobson, *Compressing IP/UDP/RTP Headers for Low-Speech Serial Links*, IETF RFC 2508, IETF Network Working Group, February 1999, incorporated herein by reference) is referred to herein as CRTP. In CRTP the time stamp delta value is coded with a varying number of bits depending on the value. A large time stamp change since the last packet causes a large delta value, which disadvantageously requires more bits in the compressed header to carry the delta value indicative of the time stamp information.

Whenever DTX (discontinuous transmission) or silent suppression is used in a real time speech service, the time stamp field of the RTP header will have a stochastic behavior difficult to predict in a stream of RTP/UDP/IP packets carrying speech. Hence, the time stamp field is one of the most difficult fields to de-compress at the receiver by means of guessing. In CRTP, the time stamp delta value is coded with a number of bits that,depends on the size of the time stamp change since the last packet. Thus, long silent or non-speech periods, require more bits to delta-modulate the time stamp field, so the first header after a silent period will typically be larger than in speech packets corresponding to a speech period.

It is therefore desirable to provide a technique for time stamp compression/decompression without the aforementioned disadvantages associated with conventional schemes.

The present invention advantageously provides techniques for efficiently compressing and reconstructing the time stamp value of a real time communications packet whose time stamp value does not fall within a normally expected sequence of time stamp values. A first part of the time stamp value is selected by the header compressor and transmitted. A second part of the time stamp value is estimated by the header decompressor based on elapsed time between receipt of consecutive packets. The header decompressor combines the second part with the first part received from the header compressor to produce a reconstructed time stamp value.

BRIEF DESCRIPTION OF THE DRAWINGS

FIG. 3 illustrates exemplary embodiments of the header compressor of FIG. 2.

FIG. 3A illustrates an example of the time stamp field of FIG. 3.

DETAILED DESCRIPTION

Figure 1:
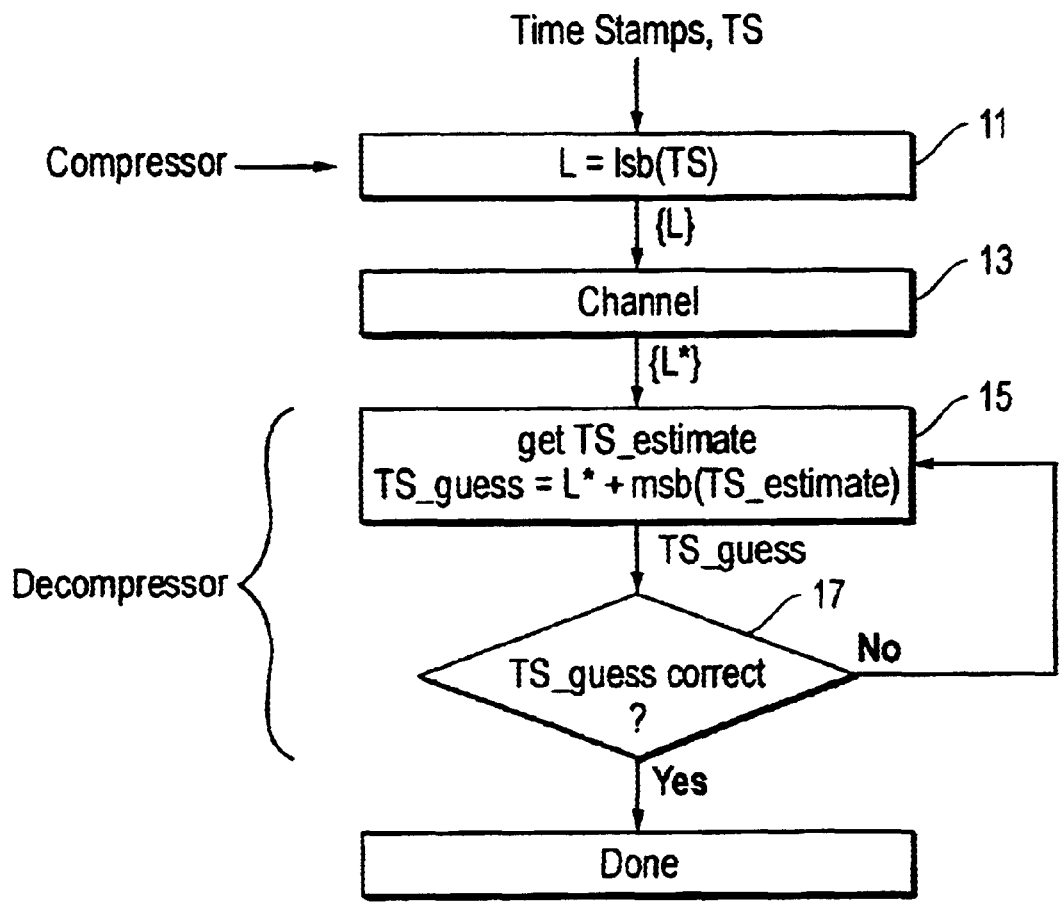
FIG. 1 conceptually illustrates exemplary time stamp compression and decompression techniques according to the invention.

FIG. 1 conceptually illustrates exemplary time stamp compression and decompression techniques for use in real time communications applications, for example real-time speech applications, according to the invention. Basically, the header decompressor at the receiver uses a local clock to estimate the elapsed time between the last speech packet before a period of speech inactivity and the first speech packet after a period of speech inactivity. Based on this elapsed time estimate, the header decompressor can make an estimate of the difference (or the delta) between the time stamp fields of these two speech packets that bound the period of speech inactivity. This estimate of the difference between time stamp values can be used, in combination with the known time stamp value of the last speech packet before speech inactivity, to make an educated guess of the time stamp value of the first speech packet after speech inactivity.

As shown in FIG. 1, at the header compressor of the transmitting end, only the least significant bits (lsb's) L of the time stamp TS of the first speech packet after speech inactivity are selected at 11 for transmission across the channel 13. The channel 13 can be a wireless channel, for example, a UMTS air interface or other cellular radio interface.

At 15 in the receiving end, an estimate of the time stamp of the received packet can be produced in the following exemplary manner. Let packet n−1 be the last received packet before the speech inactivity period, and let packet n designate the next successive speech packet, namely the first speech packet after the period of speech inactivity. If the header decompressor at the receiving end notes the time T(n−1) at which packet n−1 arrived, and also notes the time T(n) at which packet n arrived, then an absolute time difference between the arrival of the two packets can be estimated by subtracting T(n−1) from T(n). This time difference represents the elapsed time between the arrivals of packet n−1 and packet n. The elapsed time can be converted into time stamp units by multiplying the elapsed time by an estimate of how much the time stamp value changes per unit time.

Let delta_T be the elapsed time represented by the aforementioned time difference T(n)−T(n−1), and let TS_change be the estimate of how much the time stamp value changes per unit time. The value TS_change can then be multiplied by the value delta_T to produce an estimate of how many time stamp units are associated with the elapsed time delta_T, in other words, an estimate of the difference between the time stamp values of packet n−1 and packet n. Thus, an estimated value of the time stamp of packet n, TS_estimate, is given by adding the estimated difference in time stamp values (TS_change multiplied by delta_T) to the known time stamp value of packet n−1. Once TS_estimate is determined at 15, then the most significant bits of TS_estimate are appended to the received version L of the least significant bits L of the actual time stamp TS, thereby yielding a guess, TS_guess, of the time stamp value of packet n. At 17, the header decompressor attempts to determine, whether TS_guess is a correct guess of the original time stamp TS. If not, then another guess can be made at 15, and the process can be repeated until a correct guess is produced or a timeout condition is satisfied.

Figure 2:
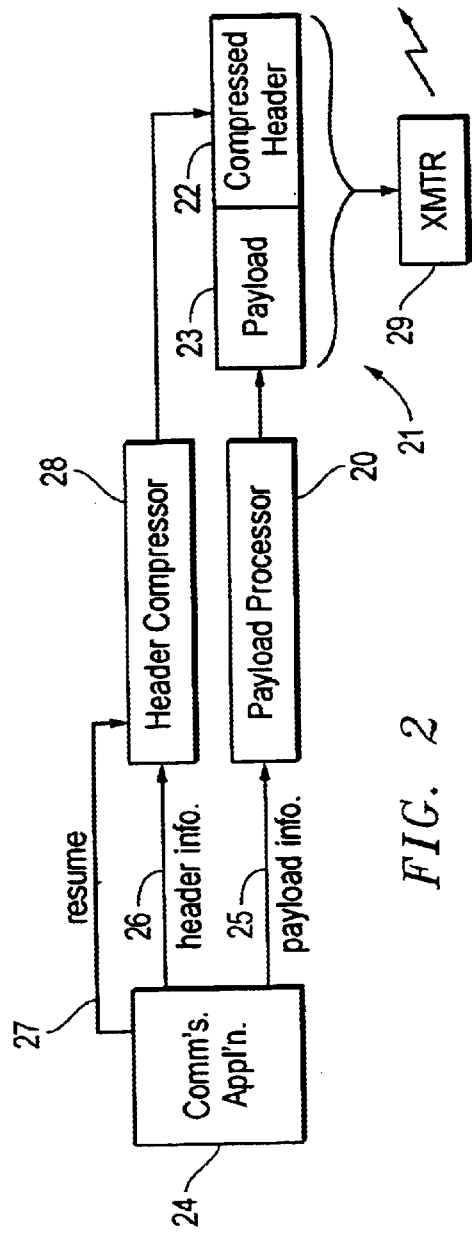
FIG. 2 illustrates an exemplary packet data transmitting station according to the invention.

FIG. 2 illustrates an exemplary packet data transmission station which can perform the exemplary time stamp compression techniques illustrated in FIG. 1. The transmission station can be, for example, a fixed-site or mobile transmitter operating in a cellular communication network. In the embodiment of FIG. 2, a packet data communications application 24 produces payload information at 25 and header information at 26. The payload information can be used in conventional fashion by payload processor 20 to produce a payload 23, and the header information 26 is applied to a header compressor 28. The header compressor 28 compresses the header information to produce a compressed header 22. The compressed header 22 and payload 23 constitute a packet 21. A conventional radio transmitter 29 can use well known techniques to transmit the packet 2.1 over a radio link such as a cellular radio link.

The communications application 24 further provides a resume signal 27 which indicates that the current payload and header information at 25 and 26 correspond to an RTP speech packet that is the first speech packet to be transmitted after a period of speech inactivity (corresponding to packet n described above with respect to FIG. 1). The header compressor 28 is responsive to activation of the signal 27 for performing inventive time stamp compression techniques including, for example, the time stamp compression techniques illustrated in FIG. 1.

FIG. 3 illustrates exemplary embodiments of the header compressor 28 of FIG. 2. In the header compressor embodiments of FIG. 3, a separator 33 receives the header information 26 from the communications application 24. The separator 33 separates the time stamp field information from the other header information received at 26, so that the time stamp information can be compressed separately from the remaining header information. A divider 35 scales the time stamp value by dividing the time stamp value by a scale value, TS_increment. Taking the exemplary case of a real-time speech service carrying speech information produced from a speech codec having a constant bit rate, the time stamp can be expected to increase by a constant incremental amount with each successive packet during a period of speech activity. The value TS_increment represents an estimate of this constant incremental amount, and can be determined, for example, by empirical observation. Thus, the divider 35 operates to scale down the time stamp value, thereby reducing the number of bits necessary to represent the time stamp value. In other embodiments, the divider 35 can be omitted or used selectively, as shown in broken line.

A least significant bit extractor 36 receives the scaled time stamp value from divider 35, and extracts the least significant bits (LSBs) from that scaled value. At 37, an appending apparatus appends to the LSBs a resume code produced by an encoder 39 in response to activation of the resume signal 27 of FIG. 2. The apparatus 37 can also append a checksum (e.g., CRC checksum), generated from the time stamp and (optionally) other header information as desired (see broken line in FIG. 3), by an optional checksum generator 38. The output of the appending apparatus 37 is applied to an input 39 of a selector 30 whose other input is connected to the output of a conventional time stamp compressor 301 that also receives the time stamp value from separator 33.

The selector 30 is controlled by the resume signal 27, so that if the resume signal 27 is active, then the LSBs, the resume code, and the checksum are provided via the selector 30 to a time stamp field 31 of the compressed header 22 of FIG. 2. On the other hand, if the resume signal 27 is inactive, then the output of the conventional time stamp compression section 301 is provided to the time stamp field 31.

Also as shown in FIG. 3, the other header information (non-time stamp information) output from separator 33 can be compressed using a conventional header compression techniques at 302, and the resulting compressed header information can then be provided to the other fields 32 of the compressed header 22 as is conventional.

FIG. 3A illustrates the time stamp field 31 produced when the resume signal 27 is active in FIGS. 2 and 3. As shown in FIG. 3A, the time stamp field 31 includes the resume code, the LSBs of the scaled time stamp value and, as shown in broken line, optionally includes the checksum generated at 38.

Figure 4:
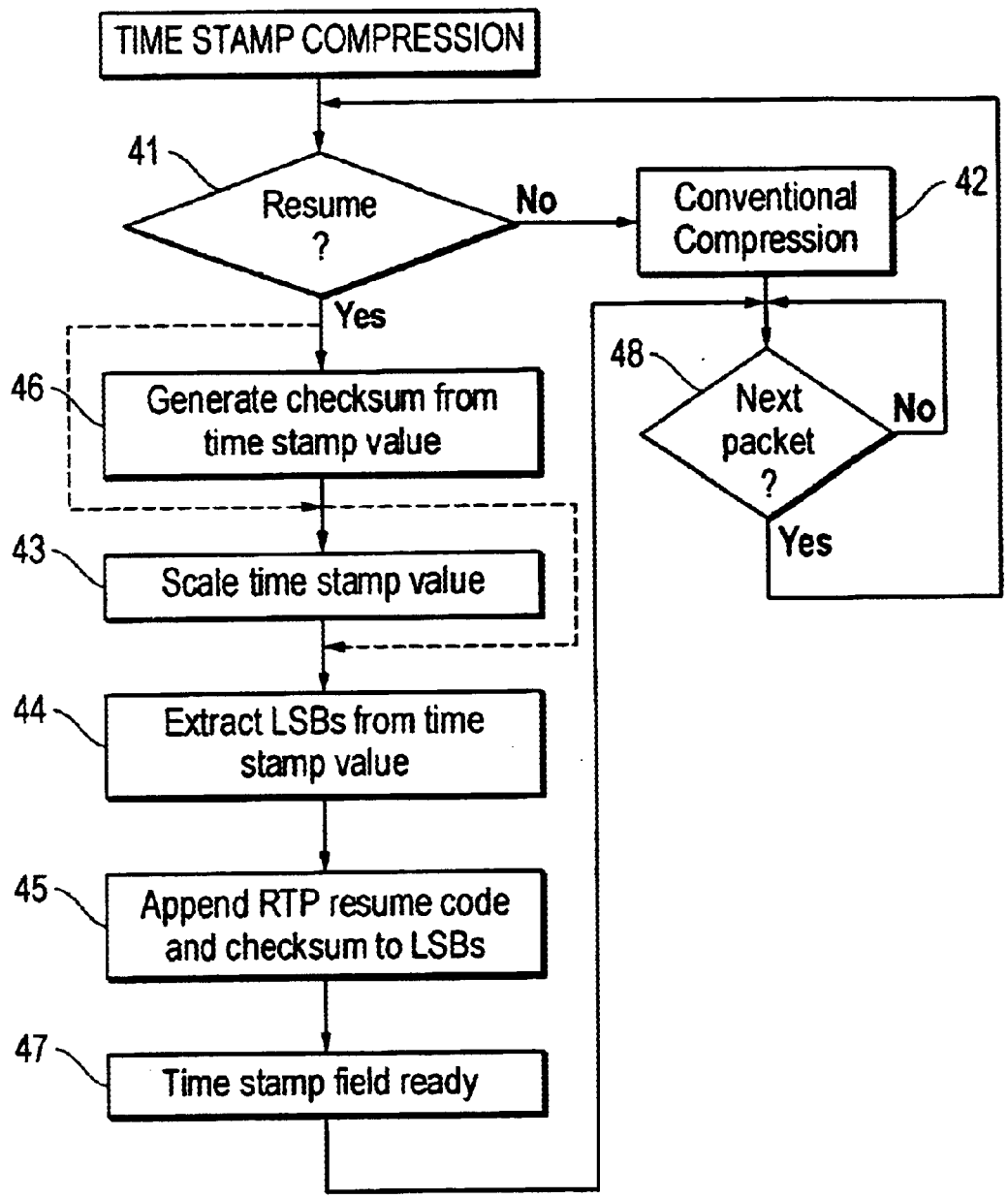
FIG. 4 illustrates exemplary operations which can be performed by the header compressor embodiments of FIGS. 2 and 3.

FIG. 4 illustrates exemplary time stamp compression operations which can be performed by the exemplary header compressor embodiments of FIG. 3. It is first determined at 41 whether the resume signal is active. If not, then time stamp compression is performed in conventional fashion at 42, and the next packet is awaited at 48. If the resume signal is active at 41, then the time stamp value (see TS in FIG. 1) is used to generate a checksum at 46. Thereafter, the time stamp value is scaled at 43 using the TS_increment value. Thereafter, the least significant bits are extracted from the scaled time stamp value at 44, and the resume code and the checksum (optional) are appended to the least significant bits at 45. The broken lines in FIG. 4 indicate that the checksum generation and scaling operations at 46 and 43 can be omitted or selectively applied in other embodiments. After the least significant bits and the resume code (and optionally the checksum) have been appended together at 45, then the time stamp field is ready for assembly into the compressed header at 47, after which the next packet is awaited at 48.

Figure 5:
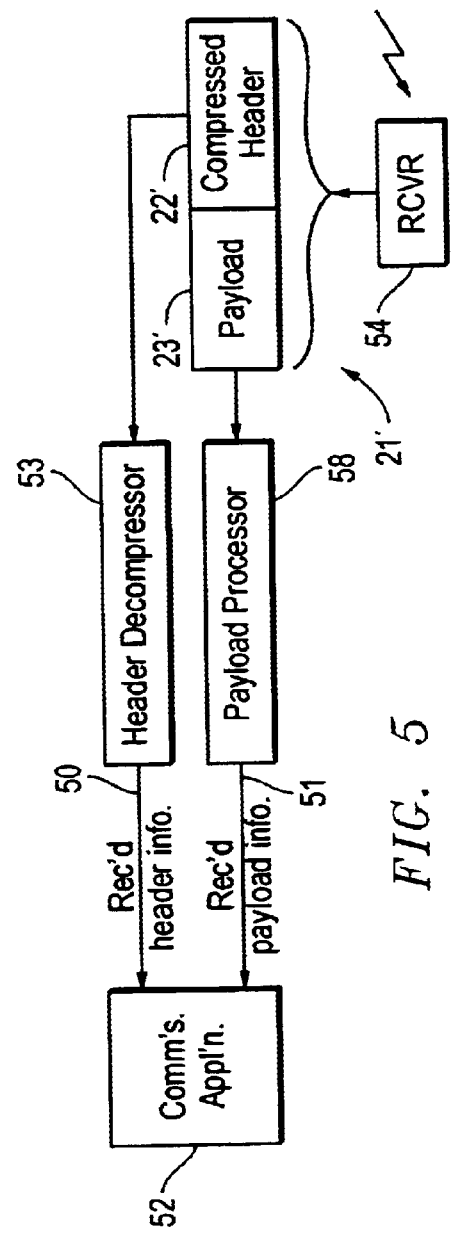
FIG. 5 illustrates an exemplary packet data receiving station according to the invention.

FIG. 5 illustrates an exemplary embodiment of a packet data receiving station which can perform the exemplary time stamp decompression techniques illustrated in FIG. 1. This receiving station can be, for example, a fixed-site or mobile receiver operating in a cellular communication network. In the embodiment of FIG. 5, a conventional radio receiver 54 can use well known techniques to receive from a radio communication link, for example a cellular radio link, a received version 21' of a transmitted packet such as the packet 21 illustrated in FIG. 2. As shown in FIG. 5, such a received version 21' would include a received version 22' of the compressed header 22 of FIG. 2 and a received version 23' of the payload 23 of FIG. 2. The received payload version 23' can be provided to a payload processor 58 which can produce, in conventional fashion, received payload information for input at 51 to a packet data communications application 52. The received compressed header version 22' is provided to a header decompressor 53 which decompresses the received version 22' to produce received header information for input at 50 to the communications application 52.

Figure 6:
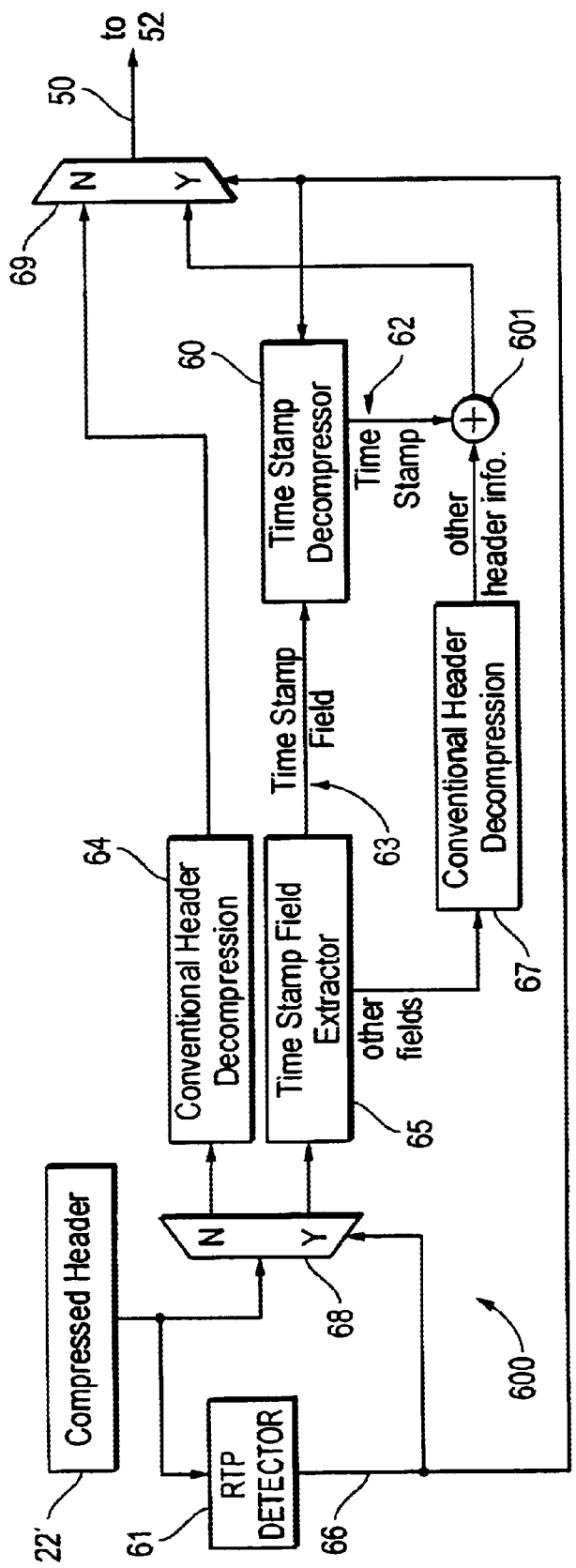
FIG. 6 illustrates exemplary embodiments of the header decompressor of FIG. 5.

FIG. 6 illustrates an exemplary embodiment of the header decompressor of FIG. 5. The received version 22' of the compressed header is input to an RTP detector 61 which can use conventional techniques to detect whether or not the received packet is an RTP packet. In response to detecting that the packet is not an RTP packet, which indicates that a period of speech inactiyvity is occurring, the detector 61 activates an output signal 66 which controls selectors 68 and 69 appropriately to cause the compressed header to be processed by a conventional header decompressor 64. If the detector 61 determines that an RTP packet has been received, then control signal 66 controls selectors 68 and 69 such that the compressed header is processed through a processing path 600 which implements time stamp field decompression according to the invention.

The processing path 600 includes a separator 65 which separates the time stamp field from the other fields of the received version 22' of the compressed header. The received versions of fields other than the time stamp field (see 32 of FIG. 3) can then be applied to a conventional header decompressor at 67. The received version of the time stamp field at 63 is input to a time stamp decompressor 60. The time stamp decompressor also receives as an input the control signal 66 output from RTP detector 61. In response to the control signal 66 and the time stamp field received at 63, the time stamp decompressor 60 outputs a time stamp at 62. This time stamp is appended by appending apparatus 601 to the other decompressed header information produced by decompressor 67, thereby forming the desired received header information which is selectively coupled via selector 69 to communications application 52 of FIG. 5 (see 50 in FIGS. 5. and 6).

Figure 7A:
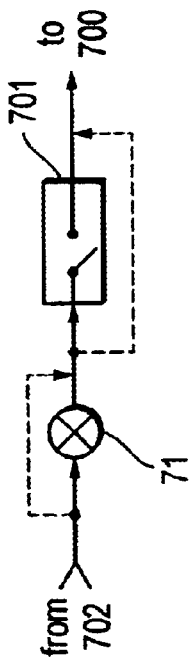
FIG. 7A illustrates other exemplary embodiments of the time stamp decompressor of FIGS. 6 and 7.
Figure 7:
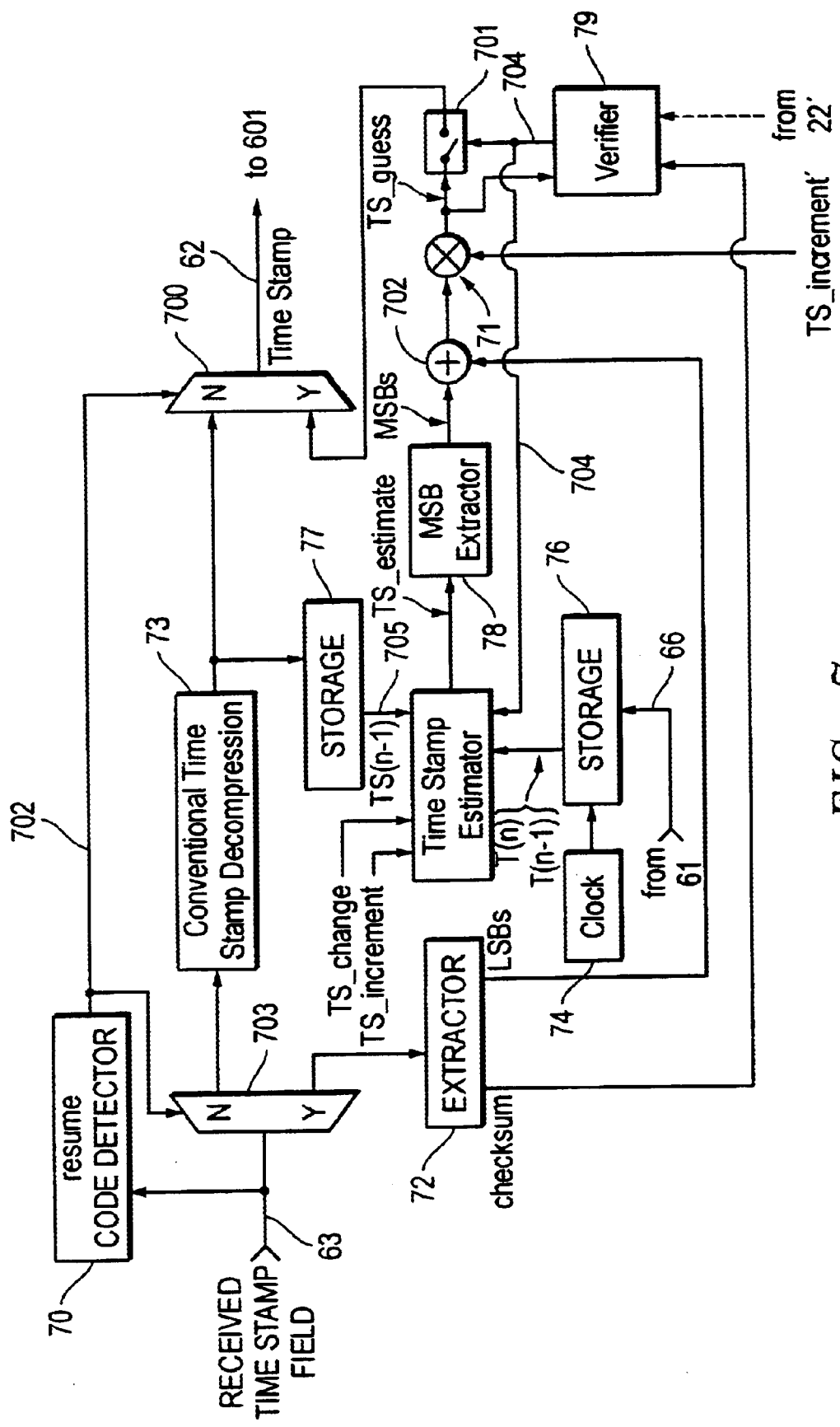
FIG. 7 illustrates an exemplary embodiment of the time stamp decompressor of FIG. 6.

FIG. 7 illustrates exemplary embodiments of the time stamp decompressor 60 of FIG. 6. In the embodiments of FIG. 7, the time stamp field received at 63 is input to a code detector 70 for detecting the resume code of FIG. 3. If the resume code is not detected, then the received RTP packet is not the first speech packet after a period of speech inactivity, so the code detector 70 outputs a control signal 702 which appropriately controls selectors 703 and 700 to permit a conventional time stamp decompressor 73 to decompress the time stamp field and produce the desired time stamp at 62 (see also FIG. 6).

If the code detector 70 detects the resume code, then the control signal 702 controls selectors 703 and 700 such that the time stamp field is decompressed according to above-described exemplary time stamp field decompression techniques according to the invention. In this case, the received time stamp field 63 is input via selector 703 to an extractor 72 which extracts received versions of the LSBs and checksum (see FIG. 3A) from the time stamp field. It should be noted that the resume code is merely one example of a technique for triggering the desired decompression operations.

A time stamp estimator 75 can produce the time stamp estimate, TS_estimate, generally as described above relative to FIG. 1. The time stamp estimator has an input 705 for receiving the time stamp of packet n−1, namely, the time stamp of the last RTP packet received before a period of speech inactivity. This time stamp value TS(n−1), produced by decompressor 73, is stored in a storage unit 77, which in turn is coupled to the estimator input 705. Each RTP time stamp output from decompressor 73 can be stored at storage unit 77 (which can be a single register), thereby insuring that the time stamp TS(n−1) of packet n−1 will be available to the time stamp estimator 75 when packet n arrives.

The time stamp estimator 75 also receives information indicative of the times T(n) and T(n−1) at which packet n and packet n−1 were received. This time information is available from a storage unit 76 which is coupled to receive local time information from a local clock 74. For each RTP packet detected by the detector 61 in FIG. 6, the storage unit 76 stores the time of arrival of that packet, as measured by the local clock 74. The storage unit 76 thus need only be a two-deep stack in order to capture the times of arrival of the aforementioned packets n and n−1.

The time stamp estimator 75 also has access to the time stamp change value TS_change as described above, and the time stamp increment value TS_increment as described above. The time stamp estimator is operable in response to the local time information received from storage unit 76, the time stamp value TS(n−1) received from storage unit 77, and the time stamp change and time stamp increment values to produce TS_estimate generally as described above. TS_estimate is applied to a most significant bit extractor 78 which extracts therefrom the most significant bits (MSBs), which constitute a truncated estimate of the time stamp value. An appending apparatus 702 appends the least significant bits (LSBs) received from extractor 72 to the most significant bits (MSBs) output from extractor 78, and the result is multiplied by TS_increment at multiplier 71 thereby producing TS_guess as described above. The time stamp estimator 75 uses TS_increment to down scale its time stamp estimate generally in the same manner described above at 35 in FIG. 3 in order to permit accurate combining of the MSBs and LSBs at 702, so the multiplier 71 is used to re-scale the result to produce TS_guess.

A verifier 79 receives as input TS_guess and the received version of the checksum from extractor 72. The verifier 79 is operable to generate a checksum from the received TS_guess value and (optionally) other information received in the compressed header 22' (see broken line), and compare this generated checksum to the received checksum. If the checksums match, then the verifier output signal 704 activates a connection unit 701 which then connects the TS_guess value to selector 700.

If the verifier 79 determines that the received checksum does not match the generated checksum, then the control signal 704 maintains the connection unit 701 in its open (illustrated) position, and informs the time stamp estimator 75 that another time stamp estimate is needed. The time stamp estimator can thus continue to produce time stamp estimates until the checksums match or until satisfaction of a timeout condition implemented, for example, in either the time stamp estimator 75 or the verifier 79.

The number of bits in TS_estimate can be, for example, equal to the number of bits in the time stamp value received by LSB extractor 36 of FIG. 3, and the number of MSBs extracted by extractor 78 in FIG. 7 can be, for example, equal to the number of most significant bits that remain (and are discarded) after extraction of the LSBs at 36 in FIG. 3. The number of LSBs extracted at 36 and the number of MSBs extracted at 78 can be determined, for example, by empirical observation to determine what combination of LSB/MSB extraction produces desired results under various conditions. For example, different combinations of LSB/MSB extraction can be used, depending on factors such as transmission delay variations, and clock precision in the compressor and decompressor. The desired combination of LSB/MSB extraction can thus be determined by empirical observation under various transmission delay variation conditions and various clock precision conditions. As one example, the number of MSBs extracted at 78 could depend on the precision of clock 74. The more precise is clock 74, the more MSBs can be extracted at 78, and vice versa. The number of LSBs extracted at 36 can then be determined based on the number MSBs extracted at 78.

The compressor and decompressor can be pre-programmed to implement a desired combination of LSB/MSB extraction, or the combination can be dynamically changeable during the course of the packet flow. For example, the compressor can select the number of LSBs to be extracted based on the actual change in the time stamp value, and can signal this information to the decompressor, for example, as a part of the resume code illustrated in FIG. 3A.

FIG. 7A illustrates in broken lines alternative embodiments of the FIG. 7 decompressor wherein: the connection unit 701 (and verifier 79) of FIG. 7 are either omitted or used selectively in correspondence to the use or omission of the checksum in FIG. 3; and/or the multiplier 71 is either omitted or used selectively in correspondence to the use or omission of the divider 35 in FIG. 3. The estimator 75 scales TS_estimate or omits scaling thereof in correspondence to the use or omission of divider 35 and multiplier 71.

Figure 8:
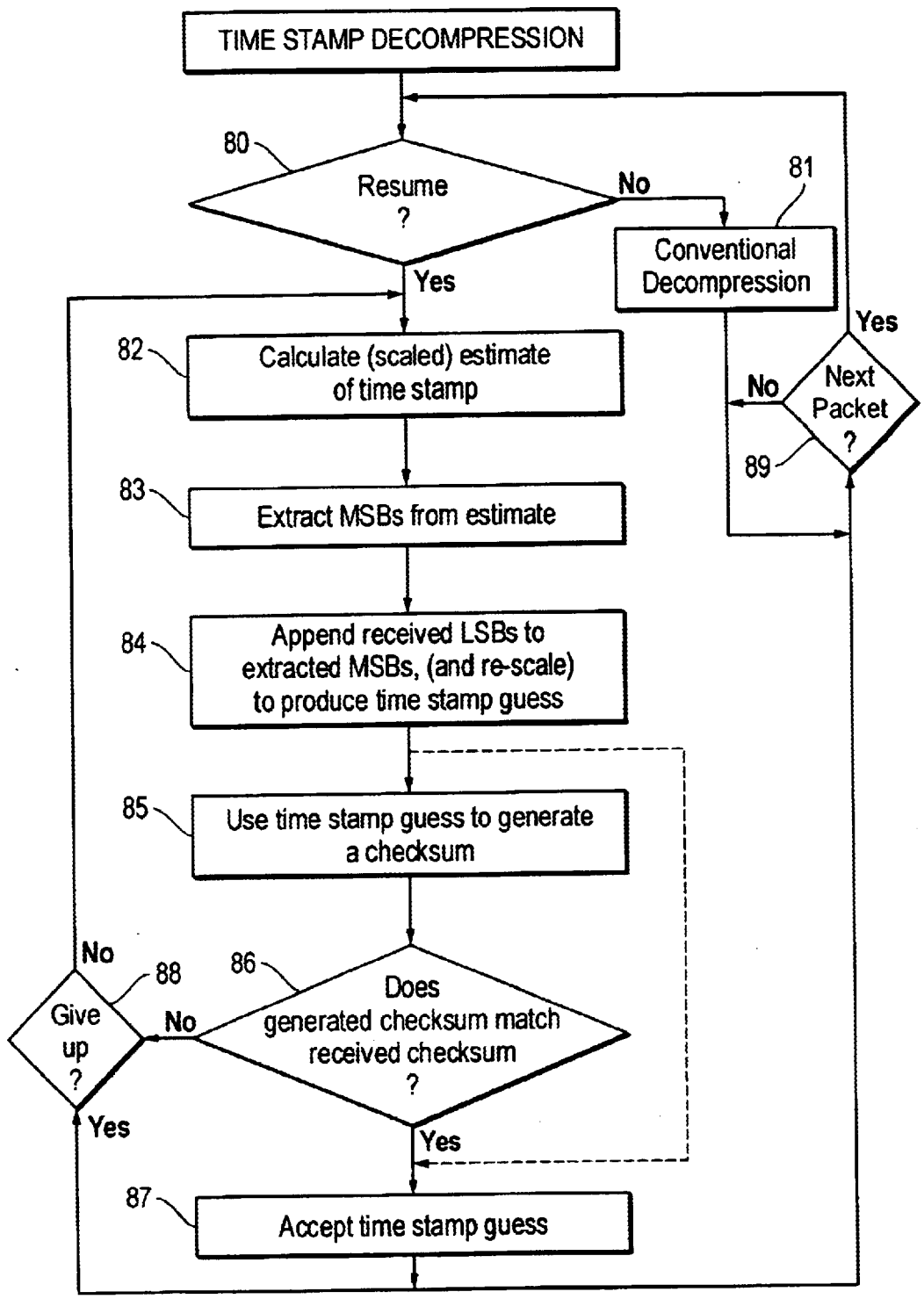
FIG. 8 illustrates exemplary operations which can be performed by the time stamp decompressor embodiments of FIGS. 6–7A.

FIG. 8 illustrates exemplary time stamp decompression operations which can be performed by the time stamp decompressor embodiments of FIGS. 6–7A. It is first determined at 80 whether or not the time stamp field includes the resume code. If not, then the time stamp field is decompressed using conventional decompression techniques at 81, and the next packet is then awaited at 89. If the resume code is detected at 80, then the time stamp estimate (TS_estimate) is calculated at 82 (with scaling as desired), and the most significant bits are extracted therefrom at 83. At 84, the least significant bits received in the compressed header are appended to the most significant bits extracted from the scaled estimate, and the result is (re-scaled as necessary) is the time stamp guess (TS_guess). Thereafter at 85, the time stamp guess is used to generate a checksum, and the generated checksum is compared at 86 to the checksum received in the time stamp field. If the generated checksum matches the received checksum, then the time stamp guess is accepted at 87, and the next packet is then awaited at 89. If the generated and received checksums do not match at 86, it is then determined at 88 whether or not to give up estimating the time stamp, for example, based on a predetermined elapsed time value, or a predetermined number of guesses. If it is decided not to give up at 88, then another scaled time stamp estimate is calculated at 82, and the operations at 83–86 are repeated. In making another time stamp estimate, the estimator 75 can, for example, change one or more of the least significant bits of the MSBs that will be extracted from the estimate. In one example, if changing a particular bit (or bits) results in successful re-estimation of the time stamp of a given packet, then this same change can be tried first when re-estimating the time stamp of a subsequent packet. If it is decided to give up at 88, then the next packet is awaited at 89.

The broken lines in FIG. 8 correspond to the embodiments of FIG. 7A, wherein checksum verification is omitted, or performed selectively.

Figure 9:
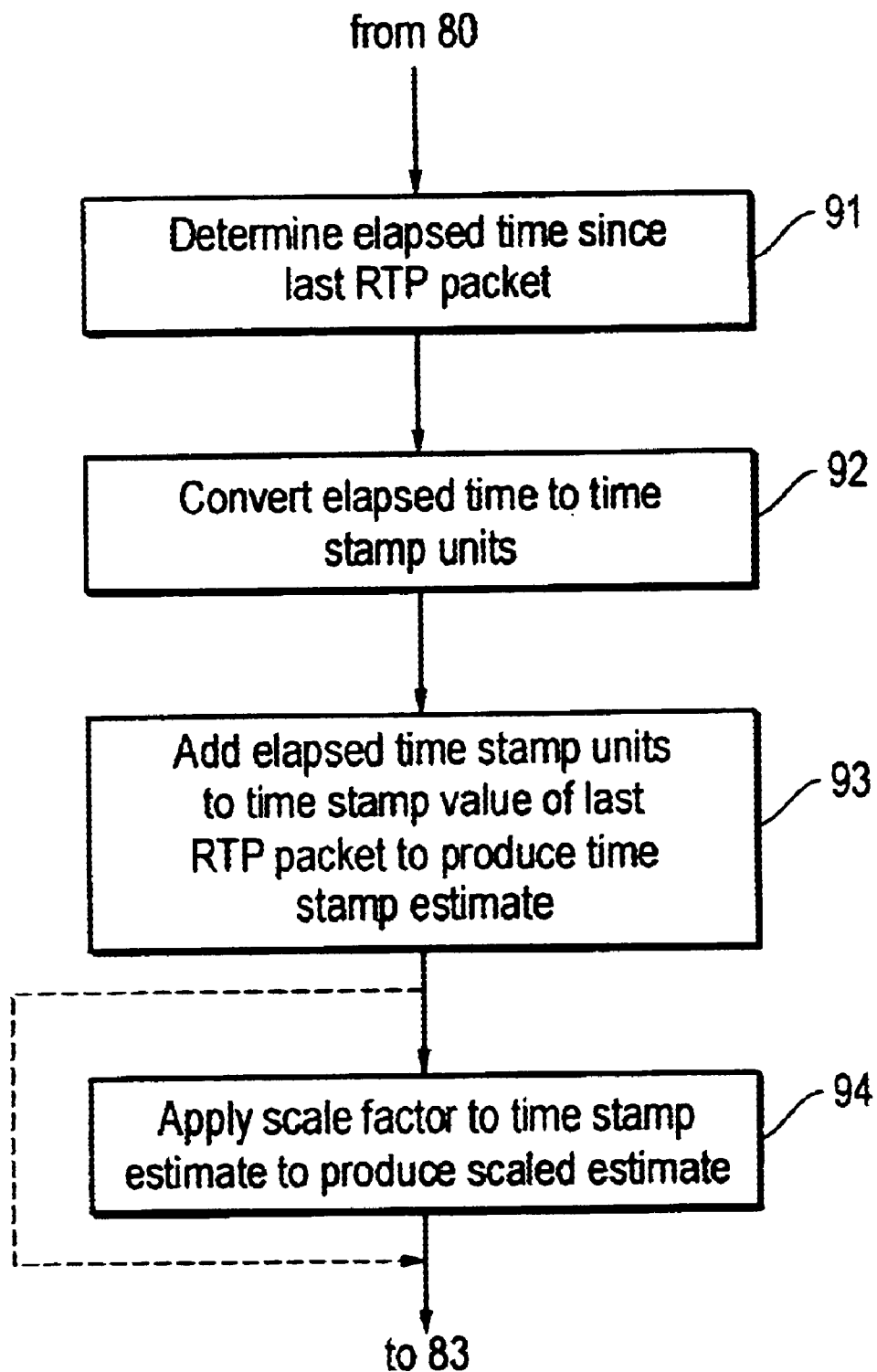
FIG. 9 illustrates exemplary operations which can be performed in FIG. 8 to calculate the scaled time stamp estimate.

FIG. 9 illustrates exemplary operations which can be performed at 82 in FIG. 8 to calculate the estimate of the time stamp. At 91, the elapsed time since the last RTP packet, (T)n–T(n–1), is determined. At 92, the elapsed time is converted into time stamp units (using TS_change). At 93, the number of elapsed time stamp units determined at 92 is added to the time stamp value (TS(n–1)) of the last RTP packet (packet n–1) to produce a time stamp estimate. At 94, a scale factor (TS_increment) is applied to the time stamp estimate produced at 93, thereby to produce the desired scaled time stamp estimate. The broken lines in FIG. 9 correspond to the embodiments of FIG. 7A, wherein scaling is omitted, or performed selectively.

In one exemplary mode of operation, the resume code of FIG. 3A is not needed. In this mode, the time stamp compression and decompression techniques of FIG. 1 are always used, so the selectors 30, 703 and 700 (see FIGS. 3 and 7) are always controlled to select "Y". Correspondingly, the operations at 41 and 42 in FIG. 4, and the operations at 80 and 81 in FIG. 8, would be omitted in this mode.

The invention described above provides, among others, the following exemplary advantages: the number of bits needed to code the time stamp value is reduced; the number of bits needed to code the time stamp value can be held constant regardless of the size of the time stamp change; and, because the absolute time stamp value is encoded at the compressor rather than encoding the amount of the time stamp change, robustness is increased.

It will be evident to workers in the art that the above-described embodiments can be readily implemented by suitable modifications in software, hardware, or both, in header compressors and decompressors of conventional packet data transmitting and receiving stations.

Although the invention is described above with respect to real time speech applications, it should be clear that the invention is applicable to any real time packet data applications, for example real-time video applications, wherein differences between time stamps of successive packets are difficult to predict at the header decompressor.

Although exemplary embodiments of the present invention have been described above in detail, this does not limit the scope of the invention, which can be practiced in a variety of embodiments.

What is claimed is:

1. A method of compressing time stamp information to produce a compressed time stamp field in a compressed header of a data packet to be transmitted across a communication channel, comprising:
   extracting a least significant part of the time stamp information; and
   providing the extracted least significant part as compressed time stamp information in the compressed time stamp field.

2. The method of claim 1, including generating a checksum from the time stamp information, and providing the checksum in the compressed time stamp field along with the extracted least significant part.

3. The method of claim 1, including scaling the time stamp information before said extracting step.

4. The method of claim 1, wherein the packet is a packet used in a real time communication service.

5. The method of claim 4, including providing a predetermined code in the compressed time stamp field along with the extracted least significant part, the predetermined code indicative that the time stamp information associated with the packet is not readily predictable.

6. The method of claim 5, wherein the packet is a speech packet used in a real time speech service, and the predetermined code is indicative that the speech packet is a first speech packet transmitted after a period of speech inactivity.

7. The method of claim 1, wherein the time stamp information includes a time stamp value represented by a plurality of bits and wherein said extracting step includes extracting selected least significant bits from the plurality of bits.

8. A method of decompressing a compressed time stamp field in a compressed header of a data packet received from a communication channel in order to produce desired time stamp information, comprising:
   determining a time difference between an arrival time of the received packet and an arrival time of a previously received packet; and
   producing an estimate of the desired time stamp information based on the time difference and further time stamp information associated with the previously received packet.

9. The method of claim 8, including obtaining from the compressed header a received version of compressed information derived from the desired time stamp information at a transmitting end of the communication channel, and combining a portion of the estimate with the received version of the compressed information to produce a guess of the desired time stamp information.

10. The method of claim 9, including generating a checksum from the guess, obtaining from the compressed header a received version of a checksum that was generated from the desired time stamp information at the transmitting end, and comparing the generated checksum to the received checksum version to determine whether the guess is correct.

11. The method of claim 9, wherein the desired time stamp information includes a time stamp value, and the received version of compressed information includes a received version of a selected least significant part of the time stamp value, and wherein said combining step includes appending the received version of the least significant part to a selected most significant part of the estimate.

12. The method of claim 9, wherein said producing step includes scaling the estimate in correspondence to a scaling operation performed on the desired time stamp information prior to derivation of the compressed information at the transmitting end.

13. The method of claim 8, wherein said determining step includes using time units to quantify the time difference.

14. The method of claim 13, wherein said determining step includes providing an estimate of a number of time stamps per time unit, and using the estimated number of time stamps per time unit to convert the time units into time stamp units, and using the time stamp units to quantify the time difference.

15. The method of claim 14, wherein said producing step includes adding the time difference quantified by time stamp units to a time stamp value associated with the previously received packet to produce the estimate.

16. An apparatus for compressing time stamp information to produce a compressed time stamp field in a compressed header of a data packet to be transmitted across a communication channel, comprising:
   an input for receiving the time stamp information;
   an extractor coupled to said input for extracting from the time stamp information a least significant part thereof; and
   an output coupled to said extractor for providing said extracted least significant part as compressed time stamp information in the compressed time stamp field.

17. The apparatus of claim 16, including a scaling apparatus coupled between said input and said extractor for scaling the time stamp information.

18. The apparatus of claim 16, wherein the packet is a packet used in a real time communication service.

19. The apparatus of claim 18, wherein said output is coupled to receive a predetermined code for inclusion in the compressed time stamp field along with said extracted least significant part, and wherein said predetermined code is provided to indicate that the time stamp information associated with the packet is not readily predictable.

20. The method of claim 19, wherein the packet is a speech packet used in a real time speech service, and the predetermined code is indicative that the speech packet is a first speech packet transmitted after a period of speech inactivity.

21. The apparatus of claim 16, wherein the time stamp information includes a time stamp value represented by a plurality of bits, and wherein said extractor is operable to extract selected least significant bits from said plurality of bits.

22. An apparatus for decompressing a compressed time stamp field in a compressed header of a data packet received from a communication channel in order to produce desired time stamp information, comprising:

a packet input for receiving packets from the communication channel;

a time recording apparatus coupled to said packet input for recording times of arrival of received packets; and an estimator coupled to said time recording apparatus and responsive to information received from said time recording apparatus for determining a time difference between an arrival time of said received packet and an arrival of a previously received packet;

said estimator having an input for receiving time stamp information associated with said previously received packet, and said estimator operable for producing an estimate of the desired time stamp information based on said time difference and said time stamp information associated with said previously received packet.

23. The apparatus of claim 22, including an input for receiving a received version of compressed information derived from the desired time stamp information at a transmitting end of the communication channel, an extractor coupled to said estimator for receiving said estimate and extracting a portion thereof, and an appending apparatus coupled to said extractor and said last-mentioned input for combining said extracted portion of said estimate with said received version of compressed information to produce a guess of the desired time stamp information.

24. The apparatus of claim 23, wherein the desired time stamp information includes a time stamp value, and the received version of compressed information includes a received version of a selected least significant part of the time stamp value, wherein said extractor is operable to extract from said estimate a most significant part thereof, and wherein said appending apparatus is operable to append the received version of the least significant part to the most significant part extracted from said estimate.

25. A method of communicating across a communication channel time stamp information associated with a data packet, comprising:

extracting a first part of the time stamp information;

providing the extracted first part as compressed time stamp information in a time stamp field of a header of the data packet;

transmitting the data packet across the communication channel;

receiving the data packet from the communication channel;

determining a time difference between an arrival time of the received packet and an arrival time of a previously received packet;

producing an estimate of a second part of the time stamp information based on said time difference and further time stamp information associated with the previously received packet; and combining the first and second parts to reconstruct the time stamp information.

* * * * *